United States Patent [19]
Lu et al.

[11] Patent Number: 5,402,075
[45] Date of Patent: Mar. 28, 1995

[54] CAPACITIVE MOISTURE SENSOR

[75] Inventors: Michael Y. Lu, Nashua, N.H.; Peter J. Pan, Tyngsboro, Mass.; James S. Li, Lowell, Mass.; Cliff L. Chuang, Lowell, Mass.

[73] Assignee: Prospects Corporation, Tyngsboro, Mass.

[21] Appl. No.: 953,506

[22] Filed: Sep. 29, 1992

[51] Int. Cl.6 .................... G01R 27/26; G01W 1/00
[52] U.S. Cl. .................. 324/664; 73/335.04; 324/690; 340/602
[58] Field of Search ............... 324/663, 664, 683, 690, 324/68.1, 667, 674, 689; 73/73, 335.04; 340/602

[56] References Cited

U.S. PATENT DOCUMENTS

| | | |
|---|---|---|
| 2,230,756 | 2/1941 | Lohry . |
| 2,617,912 | 11/1952 | Colvin . |
| 2,640,958 | 6/1953 | Davis . |
| 2,693,355 | 11/1954 | Puccinelli . |
| 2,705,168 | 3/1955 | Cody . |
| 2,731,588 | 1/1956 | McLeod . |
| 2,748,687 | 6/1956 | Ballard . |
| 2,753,508 | 7/1956 | Inman . |
| 2,754,460 | 7/1956 | Goldman . |
| 2,802,694 | 8/1957 | Murray . |
| 2,823,346 | 2/1958 | Weber . |
| 2,991,069 | 7/1961 | Onksen et al. . |
| 2,994,525 | 3/1960 | Onksen et al. . |
| 3,168,303 | 2/1965 | Skinner . |
| 3,231,880 | 1/1966 | Stein . |
| 3,299,571 | 1/1967 | Carpenter et al. . |
| 3,307,095 | 2/1967 | Redmond, Jr. . |
| 3,330,199 | 7/1967 | Campbell . |
| 3,386,022 | 5/1968 | Redmond, Jr. . |
| 3,391,268 | 7/1968 | Libby . |
| 3,601,675 | 8/1971 | Radtke . |
| 3,727,348 | 4/1973 | Steinmann et al. . |
| 3,747,953 | 3/1989 | Goes et al. . |
| 3,793,772 | 2/1974 | Kouth . |
| 4,132,881 | 1/1979 | Ciarniello et al. ............ 73/73 |
| 4,257,319 | 3/1981 | Kucharczyk . |
| 4,278,922 | 7/1981 | Grebe . |
| 4,304,070 | 12/1981 | Musaccia . |
| 4,338,526 | 7/1982 | Martin et al. . |
| 4,347,465 | 8/1982 | Goerlter et al. . |
| 4,351,016 | 9/1982 | Felbinger . |
| 4,376,971 | 3/1983 | Landgraf et al. . |
| 4,410,843 | 10/1983 | Sauer et al. . |
| 4,458,445 | 7/1984 | Sauer et al. . |
| 4,458,446 | 7/1984 | Mochida . |
| 4,464,651 | 8/1984 | Duhame . |
| 4,478,049 | 10/1984 | Fukui et al. . |
| 4,481,450 | 11/1984 | Watanabe et al. . |
| 4,502,726 | 3/1985 | Adams . |
| 4,533,901 | 8/1985 | Lederle . |
| 4,546,845 | 10/1985 | Meyer et al. . |
| 4,561,691 | 12/1985 | Kawai et al. . |
| 4,578,995 | 4/1986 | Meyer .................... 73/171 |
| 4,621,223 | 11/1986 | Muzkami et al. . |
| 4,628,434 | 12/1986 | Tashiro et al. . |
| 4,641,067 | 2/1987 | Iizawa et al. . |
| 4,686,598 | 8/1987 | Herr . |
| 4,692,751 | 9/1987 | Upton et al. ............ 340/602 |
| 4,742,763 | 5/1988 | Holter et al. . |

(List continued on next page.)

FOREIGN PATENT DOCUMENTS

| | | | |
|---|---|---|---|
| 0446167 | 9/1991 | European Pat. Off. ........... 324/664 |
| 0018850 | 1/1986 | Japan .................. 324/664 |
| 0076439 | 4/1987 | Japan .................. 324/689 |
| 0292244 | 11/1989 | Japan .................. 324/689 |
| 3-163345 | 7/1991 | Japan .................. 324/664 |

(List continued on next page.)

Primary Examiner—Maura K. Regan
Attorney, Agent, or Firm—Fish & Richardson

[57] ABSTRACT

A capacitive moisture sensor includes insulator means; capacitance means including a sensing capacitor having a plurality of spaced capacitive sensor conductors mounted with the insulator means for exposure to the atmosphere; and first and second electrodes mounted with the insulator means remote from the spaced capacitive sensor conductors; means for applying a periodic input current across the first and second electrodes; and means for detecting a change in capacitance between the first and second electrodes indicative of moisture bridging at least two of the capacitive sensor conductors.

25 Claims, 4 Drawing Sheets

U.S. PATENT DOCUMENTS

| | | | |
|---|---|---|---|
| 4,743,902 | 5/1988 | Andermo | 324/683 |
| 4,746,845 | 5/1988 | Mizuta et al. | |
| 4,749,924 | 6/1988 | Watanabe et al. | |
| 4,803,807 | 2/1989 | Stockermann et al. | |
| 4,804,140 | 2/1989 | Cantrell | |
| 4,808,894 | 2/1989 | Mizuta | |
| 4,810,944 | 3/1989 | Chance | |
| 4,870,333 | 9/1989 | Itoh et al. | |
| 4,875,406 | 10/1989 | Holter et al. | |
| 4,899,645 | 2/1990 | Wolfe et al. | |
| 4,908,554 | 3/1990 | Chance | |
| 4,909,044 | 3/1990 | Gudmundsen | |
| 4,911,257 | 3/1990 | Kajimoto et al. | |
| 4,922,168 | 5/1990 | Waggamon et al. | |
| 4,933,610 | 6/1990 | Memmola | |
| 4,942,806 | 7/1990 | Hwang | |
| 4,943,757 | 7/1990 | Richter et al. | |
| 4,944,116 | 7/1990 | Mewald | |
| 4,956,591 | 9/1990 | Schierbeek et al. | |
| 4,983,896 | 1/1991 | Sugiyama et al. | |
| 5,040,411 | 8/1991 | Medzius | 73/73 |
| 5,283,711 | 2/1994 | Schmitz | 73/335.04 |
| 5,296,819 | 3/1994 | Kuroiwa et al. | 73/335.04 |

FOREIGN PATENT DOCUMENTS

| | | | |
|---|---|---|---|
| 3-167463 | 7/1991 | Japan | 324/664 |
| 0798634 | 1/1981 | U.S.S.R. | 324/683 |

CAPACITIVE MOISTURE SENSOR

FIELD OF INVENTION

This invention relates to a capacitive moisture sensor.

BACKGROUND OF INVENTION

Conventional moisture sensors such as used on houses or vehicles to close windows or raise convertible roofs typically employ a pair of spaced electrical wires, the resistance between which drops from approximately 19 megohms to 3 megohms when rain bridges the two wires. By moisture is meant all forms of water including precipitation, e.g., dew, snow, sleet, hail, which can result in water bridging the conductors. The decrease from 19 to 3 megohms can be sensed as an indicator of moisture present. But such devices are electrically noisy, have poor sensitivity and are generally unattractive when installed, especially on the smooth contours of a well-designed automobile for example. Another problem with such devices is that they generally require high voltage and the exposure of the conductors and leads renders them vulnerable to corrosion by the weather and consequent short life. The corrosion is especially rapid in the presence of high voltages used in the range of 1 to 20 volts.

SUMMARY OF INVENTION

It is therefore an object of this invention to provide an improved moisture sensor.

It is a further object of this invention to provide such an improved moisture sensor which senses the effect on the electrical capacitance to detect the presence of moisture.

It is a further object of this invention to provide such an improved moisture sensor which is simple, reliable, accurate and highly sensitive.

It is a further object of this invention to provide such an improved moisture sensor which is small, compact, easy to install, and is unobtrusive.

It is a further object of this invention to provide such an improved moisture sensor which minimizes exposure of the electrodes and other corrosible parts.

It is a further object of this invention to provide such an improved moisture sensor which is safer, longer lived and requires lower voltage.

The invention results from the realization that a truly simple and effective moisture sensor can be achieved using a sensing capacitor having a plurality of spaced capacitive sensor conductors on the outside surface of an insulator and a pair of electrodes on the inside, with some means to detect the change in capacitance reflected in a periodic current applied to the electrodes when moisture bridges two of the capacitive sensor conductors; and from the further realization that virtual immunity from degradation of the sensor by contamination or drift can be achieved by employing a second reference capacitor and detecting the phase difference in the periodic current applied to both as an indication of the change in capacitance due to the presence of moisture.

A capacitive moisture sensor includes insulator means and capacitance means including a sensing capacitor having a plurality of spaced capacitive sensor conductors mounted with the insulator means for exposure to the atmosphere. The capacitance means also includes first and second electrodes mounted with the insulator means remote from the spaced capacitive sensor conductors. There are means for applying a periodic input current across the first and second electrodes and means for detecting a change in capacitance between the first and second electrodes indicative of moisture bridging at least two of the capacitive sensor conductors.

In a preferred embodiment the insulator means may be a printed circuit board and/or may be a glass member. The glass member may be a window. The window may be part of a vehicle. The glass member may also be a sun roof. The insulator means may have an outside surface exposed to the weather and an inside surface to shield it from the weather. The capacitive sensor conductors are on the exposed outside surface and the first and second electrodes are on the shielded inside surface. The capacitance means may further include a reference capacitor including a plurality of spaced capacitive reference conductors mounted with the insulator means proximate the capacitive sensor conductors. The reference capacitor may also include third and fourth electrodes mounted with the insulator means and remote from the spaced capacitive reference conductors. There may be covering means for shielding the capacitive reference conductors from the weather. The means for applying a periodic current may apply a periodic current to the third and fourth electrodes as well as the first and second electrodes. The means for detecting may include a phase detector responsive to the periodic current applied to the first and second electrodes and to the third and fourth electrodes for determining a phase difference representative of moisture bridging at least two of the capacitive sensor conductors. The reference capacitor may include a plurality of spaced capacitive reference conductors similar to the sensing capacitor. The capacitance means may be incorporated in an emblem of an automobile, an antenna base on an automobile, or any other desirable location.

DISCLOSURE OF PREFERRED EMBODIMENT

Other objects, features and advantages will occur to those skilled in the art from the following description of a preferred embodiment and the accompanying drawings, in which.

This invention may be accomplished with a moisture sensor including a sensing capacitor. The sensing capacitor has a plurality of spaced capacitive sensing conductors on a surface which is exposed to potential moisture. These conductors are mounted on an insulator on the opposite side of which, sheltered from the potential moisture, is a pair of electrodes. The electrodes are connected to a source of periodic current, for example an AC source. Thus when moisture occurs and bridges at least two of the conductors, the capacitance of the sensing capacitor will change and this can be detected as an indication of the presence of the moisture. Typically the insulator can be a plastic or glass material; for example the conductors could be formed on a conventional printed circuit board. The insulator could also include glass, such as the glass of a window or sun roof on an automobile. The moisture sensor may be used in any application. One of its advantages is that the only portion that needs to be exposed are the capacitive sensor conductors, and they have only a small voltage across them which will not lead to excessive corrosion. The electrodes and electrical connections, on the other hand, may be shielded form the moisture-producing environment. Typically an AC current having a frequency of 100 Hz to 100 KHz and a voltage of 1 to 20 volts with a current of 1 to 100 mA is used to energize the system. The conductors are typically 1 to 5 inches long and are separated by about 1 to 5 inches. The insulator between the electrodes may have a thickness in the range of 1/16 to ¼ inch. The insulator between the capacitive sensor conductors and the electrodes may be glass having a thickness of 1/10 to ½ inch, plus a circuit board having a thickness of 1/10 to ¼ inch.

The second reference capacitor can be formed on the same circuit board but with a covering over it so that it is not exposed to moisture. A second pair of electrodes proximate the first pair, also on the inside of the insulating means, can be employed to monitor the capacitance of the reference capacitor. In this way, any difference occurring in the phase between the two capacitor currents can be used to indicate the presence of moisture on the sensing capacitor while at the same time any contamination or environmental conditions which might distort the reading can be compensated for by the presence of the proximate reference capacitor.

Figure 1:
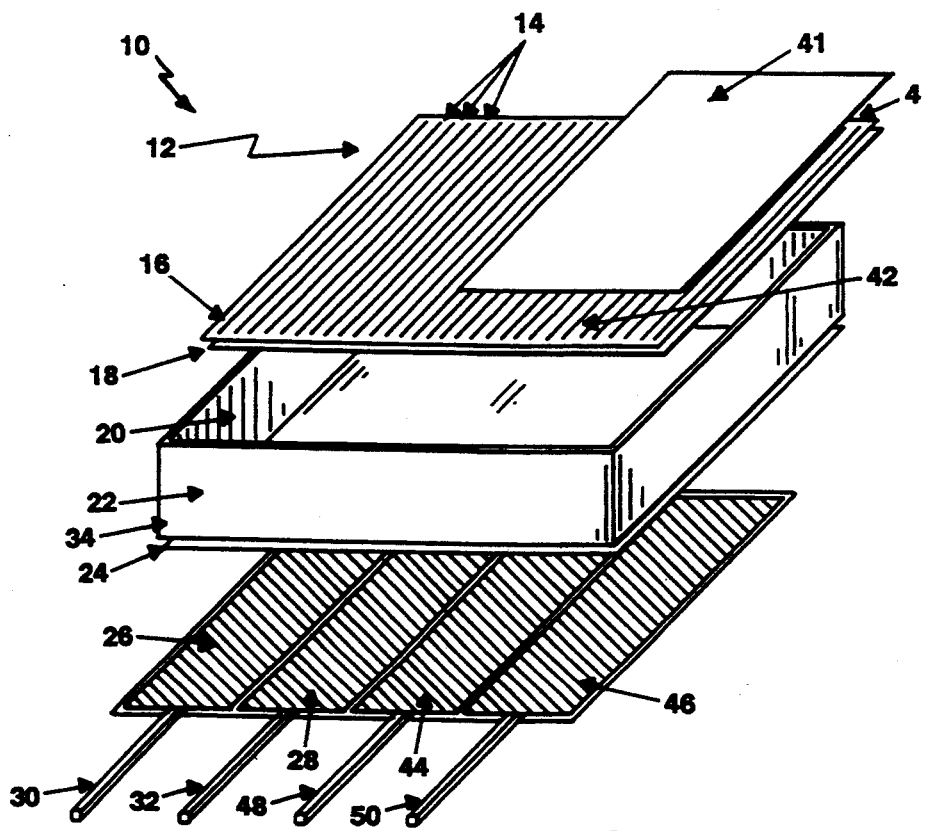
FIG. 1 is an exploded three-dimensional schematic view of a moisture sensor according to this invention.

There is shown in FIG. 1 a moisture sensor 10 according to this invention which includes a sensing capacitor 12 including a plurality of spaced capacitive sensor conductors 14 disposed on circuit board 16 which is adhered by double-sided tape or glue 18 to the outside 20 of a sheet of glass or other insulated media 22. A second layer of tape or glue 24 is used to adhere the sensing electrodes 26 and 28 having leads 30 and 32 to the bottom surface 34 of insulator 22. Reference capacitor 40 includes a similar plurality of spaced capacitive reference conductors 42 which can be mounted on a different board or the same board 16 and applied in the same way, using tape or glue 18, to the external surface 20 of insulator 22. Cover 41 is formed of a plastic material or other moisture-impervious material and is securely fastened such as by adhesive to reference capacitor 40 so that it shields conductors 42 from moisture and other weather conditions. The second pair of electrodes 44 and 46 having leads 48 and 50 may be applied with the same tape or glue 24 to the weather- or moisture-shielded surface 34 of insulator 22.

Figures 2, 3, 4:
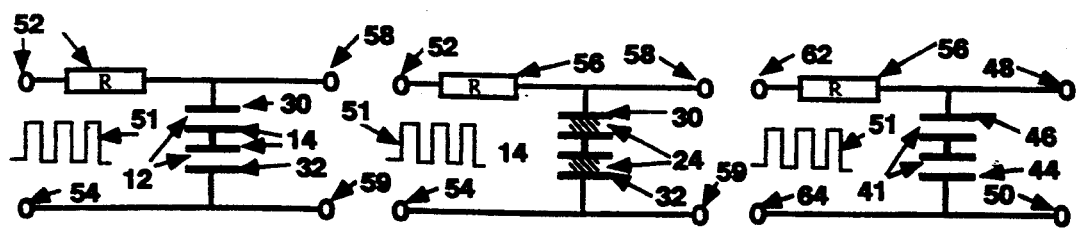
FIG. 2 is a schematic equivalent circuit showing the condition of the sensing capacitor portion of FIG. 1 with no moisture present.
FIG. 3 is a schematic equivalent circuit similar to FIG. 2 with moisture present.
FIG. 4 is an equivalent schematic circuit of the reference capacitor of FIG. 1 when moisture is present and when moisture is not present.

In operation, when there is no moisture present capacitor 12 appears as in FIG. 2, where it is energized by a 1 to 20 voltage square wave 51 and applied to input terminals 52 and 54. Resistor 56 having a value of 1K to 1M ohms sets up an RC network with sensing capacitor 12 having a capacitance of 0.001 to 20 microfarads. When moisture is present as shown in FIG. 3, the capacitance changes somewhat from 0.001 microfarads to 20 microfarads due to the presence of raindrops 60 which shorts out or bridges across two or more of conductors 14. The change in capacitance is sensed at output terminals 58 and 59.

In contrast, reference capacitor 40 receives the same square wave 51 at the same magnitude at its input terminals 62, 64 and employs a resistor 66 having the same value as resistor 56. However, the reference capacitor 40 never receives moisture because it is covered by cover 41. The capacitance of capacitor 40 is sensed at output terminals 68 and 70.

Figure 5:
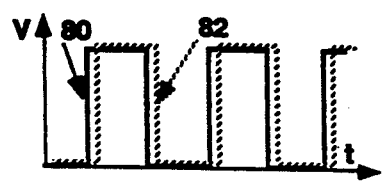
FIG. 5 illustrates the phase difference in the waveforms generated by the sensing capacitor and reference capacitor when no rain is present.
Figure 6:
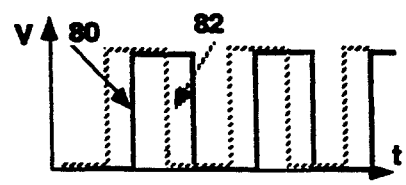
FIG. 6 is a view similar to FIG. 5 when moisture is present.

The effect can be seen in FIG. 5 where normally in a no rain or no moisture condition, the output at terminals 58, 59 from capacitor 12 is indicated by waveform 80 while the output signal from the reference capacitor 40 is shown at 82. It is apparent that there is only a small phase difference between the two under the no moisture condition. In contrast, as shown in FIG. 6, there is a marked increase in the phase difference when rain or moisture is present. Specifically while the signal 80 from sensing capacitor 12 leads waveform 82 of reference capacitor 40 in the no rain condition shown in FIG. 5. In the rain condition, FIG. 6, waveform 82 of the reference capacitor 40 leads waveform 80 of sensing capacitor 12. In this way a clear, reliable and accurate determination can be made when moisture is present.

Figure 7:
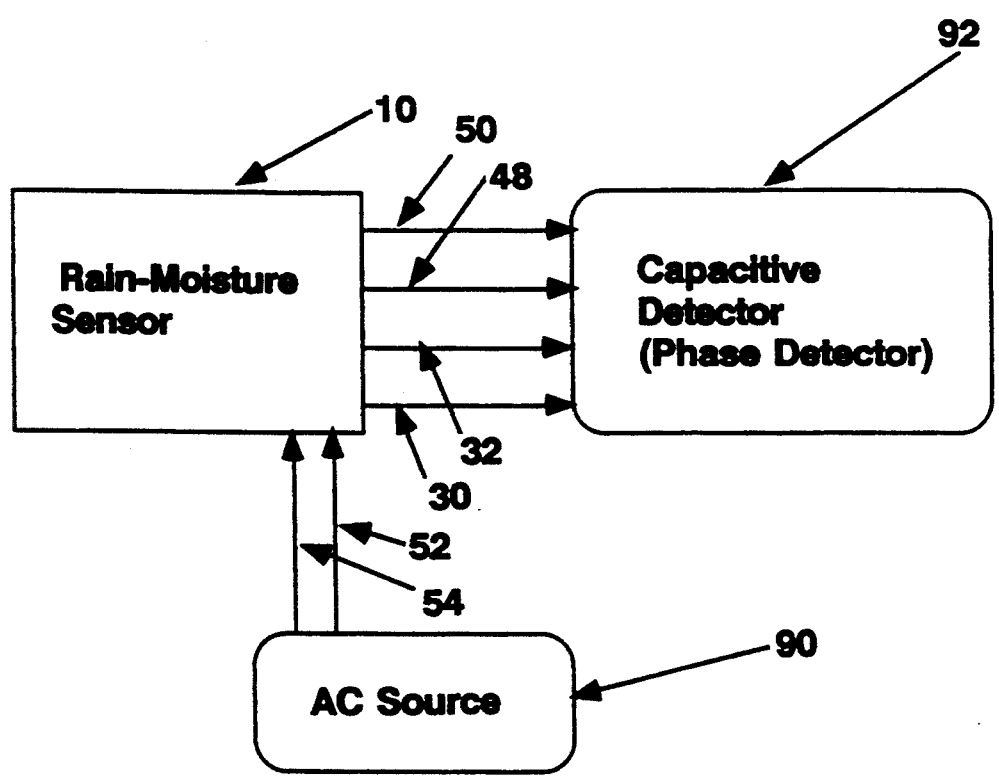
FIG. 7 is a block diagram showing a moisture sensor according to this invention along with a capacitance detector and an AC source.
Figure 8:
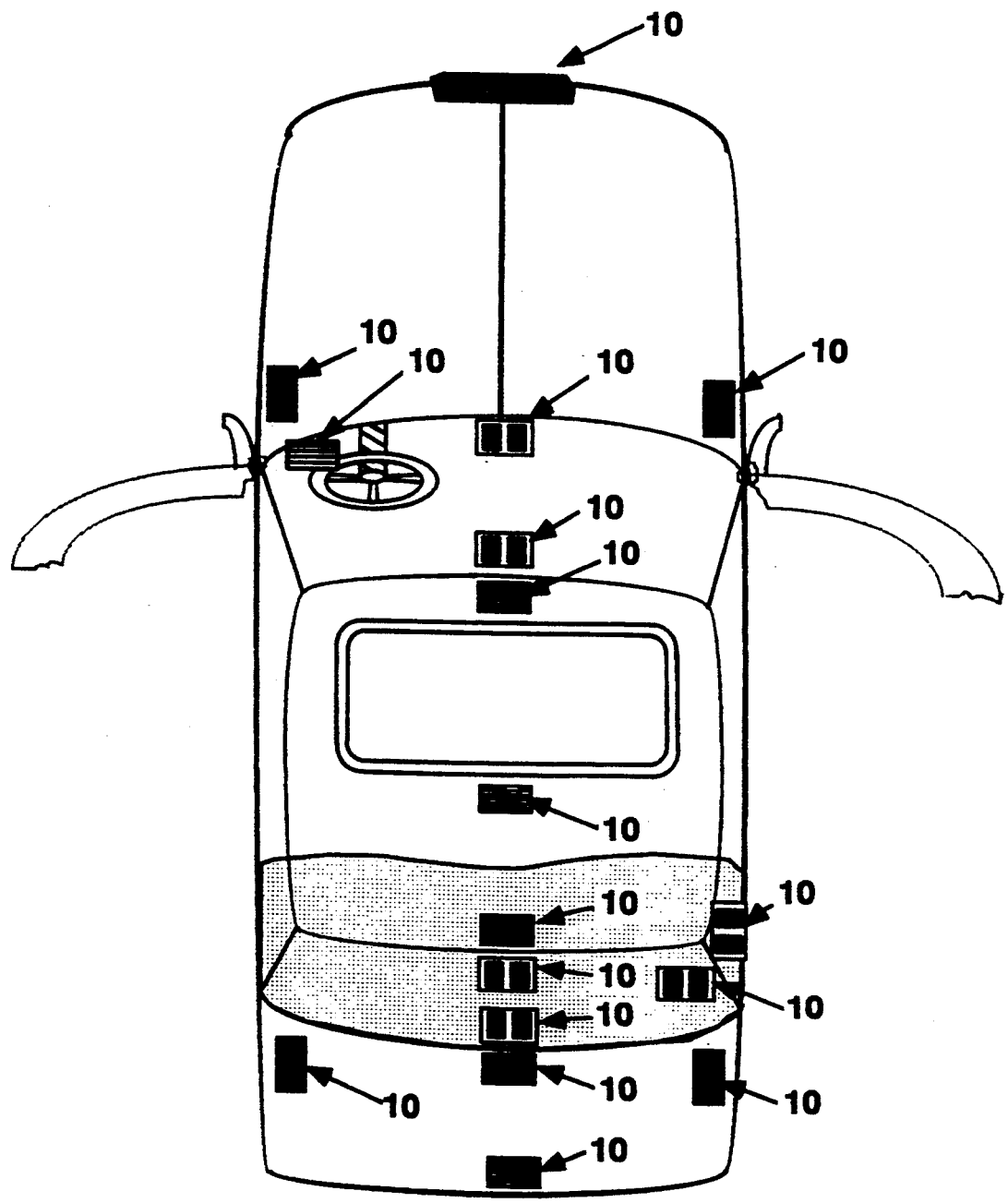
FIG. 8 is a top plan schematic view of an automobile showing various locations for the moisture sensor according to this invention.

Moisture sensor 10, FIG. 7, is energized to receive input wave 51 by AC source 90. The capacitance detector 92 may be an analog comparator or timer based comparator to determine the capacitance when just sensing capacitor 12 is used and only signals 30 and 32 are supplied. When reference capacitor 40 is also used and signals 48 and 50 are present, then capacitance detector 92 may be a phase detector such as a timer based comparator constructed from voltage comprator timer and RC networks. Moisture sensor 10 according to this invention may be placed in various places on an automobile such as indicated in FIG. 8. No other insulator is necessary if a glass window is used; however, if other parts of the automobile body are used, then of course an insulator may be necessary.

Figure 9:
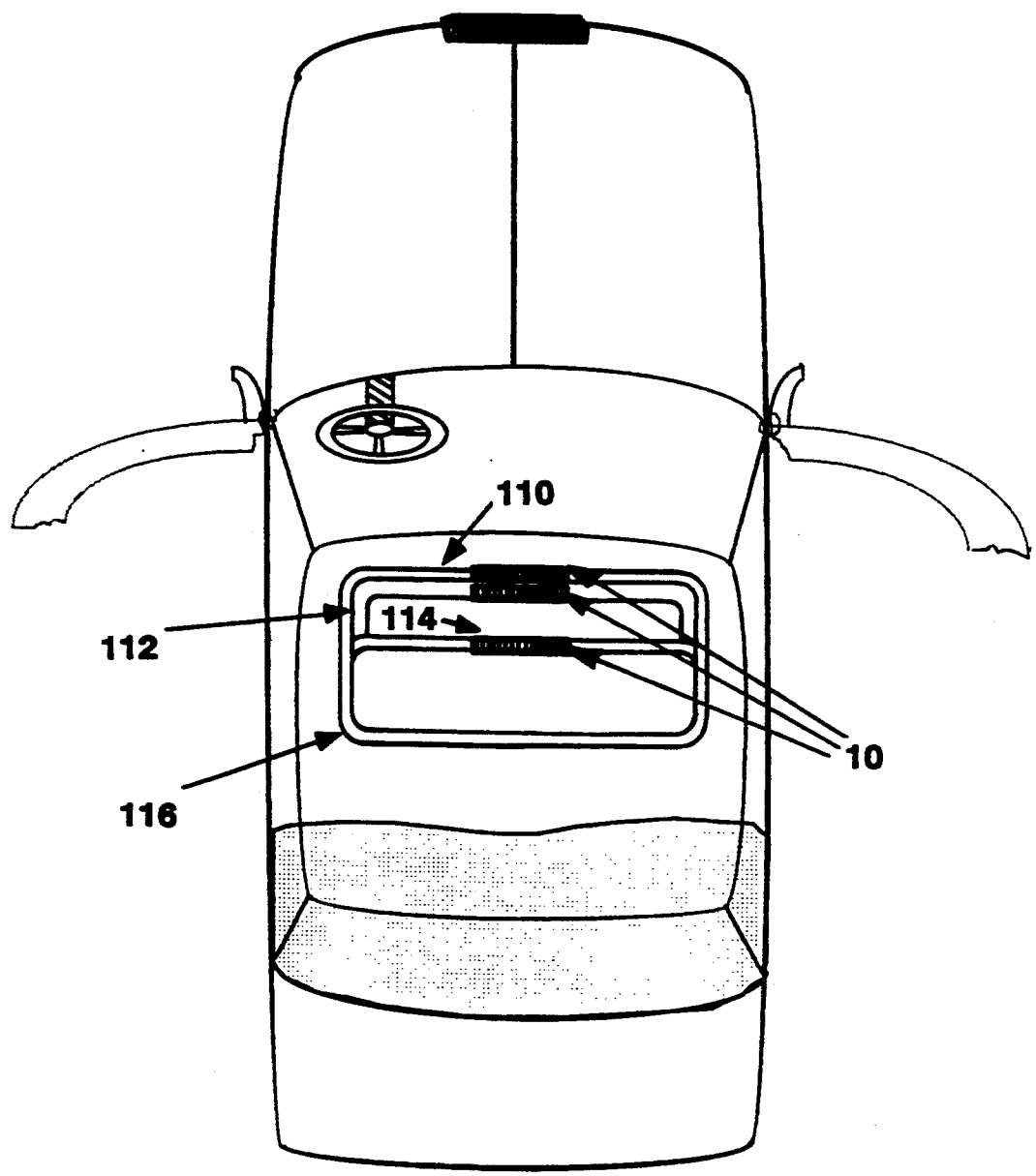
FIG. 9 is a view similar to FIG. 8 showing the possible locations of the moisture sensor according to this invention on various parts of a sun roof.

Conveniently, as shown in FIG. 9, moisture sensor 10 may be placed on the trim ring 110, or the lower level of the frame 112, or on the moving roof panel 114 of a sun roof 116, FIG. 9.

For aesthetic reasons it may be desirable to include moisture sensor 10 in the emblems or the logos of the particular automobile or on the retractable antenna base.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A capacitive moisture sensor comprising:
   an insulator;
   a sensing capacitor having spaced capacitive sensor conductors mounted with said insulator for exposure to the atmosphere;

first and second electrodes mounted with said insulator remote from said spaced capacitive sensor conductors; and circuitry connected to apply a current to said first and second electrodes and to detect a change in capacitance between said first and second electrodes indicative of moisture bridging two of said capacitive sensor conductors.

2. The capacitive moisture sensor of claim 1 in which said insulator includes a glass member.

3. The capacitive moisture sensor of claim 2 in which said glass member comprises a window of a vehicle.

4. The capacitive moisture sensor of claim 1 in which said insulator includes a printed circuit board.

5. The capacitive moisture sensor of claim 1 in which said insulator has an outside surface exposed to the weather and an inside surface shielded from the weather, and wherein said capacitive sensor conductors are on the exposed outside surface.

6. The capacitive moisture sensor of claim 1 in which said first and second electrodes are on the shielded inside surface.

7. The capacitive moisture sensor of claim 1, further comprising a reference capacitor including spaced capacitive reference conductors mounted with said insulator proximate said capacitive sensor conductors, third and fourth electrodes mounted with said insulator means remote from said spaced capacitive reference conductors, and a cover for shielding said capacitive reference conductors from the weather.

8. The capacitive moisture sensor of claim 7 in which said circuitry applies a periodic current to said third and fourth electrodes.

9. The capacitive moisture sensor of claim 8 in which said circuitry includes a phase detector responsive to said current applied to said first and second electrodes and to said current applied to said third and fourth electrodes for determining a phase difference representative of moisture bridging two of said capacitive sensor conductors.

10. The capacitive moisture sensor of claim 2 in which said glass member is a sun roof.

11. The capacitive moisture sensor of claim 1, further comprising a reference capacitor.

12. The capacitive moisture sensor of claim 11 in which said circuitry includes a phase detector responsive to said reference capacitor and said sensing capacitor for determining a phase difference representative of precipitation bridging two of said capacitive sensor conductors.

13. The capacitive moisture sensor of claim 1 in which said sensing capacitor is incorporated in an antenna base on an automobile.

14. The capacitive moisture sensor of claim 1 in which said sensing capacitor is incorporated in an the emblem of an automobile.

15. A capacitive moisture sensor comprising;
insulator means;
capacitance means including a sensing capacitor having a plurality of spaced capacitive sensor conductors mounted with said insulator means for exposure to the atmosphere;
first and second electrodes mounted with said insulator means remote from said spaced capacitive sensor conductors;
means for applying a periodic input current across said first and second electrodes; and
means for detecting a change in capacitance between said first and second electrodes indicative of moisture bridging two of said capacitive sensor conductors.

16. The capacitive moisture sensor of claim further comprising a reference capacitor mounted on said insulator means, and in which said means for detecting includes a phase detector responsive to said reference capacitor and said sensing capacitor for determining a phase difference representative of precipitation bridging two of said capacitive sensor conductors.

17. A capacitive moisture sensor comprising:
insulator means;
capacitance means including a sensing capacitor having a plurality of spaced capacitive sensor conductors mounted with said insulator means for exposure to the atmosphere, a reference capacitor including a plurality of spaced capacitive reference conductors mounted with said insulator means proximate said capacitive sensor conductors, and means for shielding said capacitive reference conductors from the atmosphere;
first and second electrodes mounted with said insulator means remote from said spaced capacitive sensor conductors and third and fourth electrodes mounted with said insulator means remote from said spaced capacitive reference conductors;
means for applying a periodic input current across said first and second electrodes; and
means for detecting a change in capacitance between said first and second electrodes indicative of moisture bridging two of said capacitive sensor conductors.

18. The capacitive moisture sensor of claim 17 in which said means for applying a periodic current applies a periodic current to said third and fourth electrodes.

19. The capacitive moisture sensor of claim 18 in which said means for detecting includes a phase detector responsive to said periodic current applied to said first and second electrodes and to said third and fourth electrodes for determining a phase difference representative of moisture bridging at least two of said capacitive sensor conductors.

20. A capacitive moisture sensor comprising:
a substrate having an outside surface exposed to the atmosphere and an inside surface shielded from the atmosphere,
a sensing capacitor defined by two spaced apart capacitor electrodes mounted on the inside surface of the substrate; and
at least two spaced sensor conductors positioned relative to the capacitor electrodes so that moisture bridging the sensor conductors causes a change in the capacitance of the capacitor, the sensor conductors being mounted on the outside surface of the substrate and exposed to the atmosphere;
wherein moisture is sensed by monitoring, through an applied current, the capacitance between the capacitor electrodes.

21. The capacitive moisture sensor of claim 20, further comprising:
a reference capacitor defined by two spaced apart reference capacitor electrodes, and positioned next to the sensing capacitor; and
at least two spaced reference conductors positioned next to the sensing conductors and relative to the reference capacitor electrodes so that moisture bridging the reference conductors would cause a change in the capacitance of the reference capacitor, the reference conductors being mounted on the outside surface of the substrate and shielded from the atmosphere.

22. The capacitive moisture sensor of claim 21, further comprising a phase detector that determines a phase difference between periodic currents applied, respectively, to the sensing capacitor and the reference capacitor, the phase difference being representative of moisture bridging at least two of the sensor conductors.

23. The capacitive moisture sensor of claim 20, further comprising:
   a reference capacitor, and
   a phase detector that determines a phase difference between periodic currents applied, respectively, to the sensing capacitor and the reference capacitor, the phase difference being representative of moisture bridging at least two of the sensor conductors.

24. The capacitive moisture sensor of claim 20, wherein the substrate comprises a window of a vehicle.

25. The capacitive moisture sensor of claim 20, wherein the substrate comprises a sun roof of a vehicle.

* * * * *